US009018039B2

(12) United States Patent
Mugiya et al.

(10) Patent No.: US 9,018,039 B2
(45) Date of Patent: Apr. 28, 2015

(54) CIRCUIT MODULE AND METHOD OF PRODUCING CIRCUIT MODULE

(71) Applicant: Taiyo Yuden Co., Ltd., Tokyo (JP)

(72) Inventors: Eiji Mugiya, Tokyo (JP); Takehiko Kai, Tokyo (JP); Masaya Shimamura, Tokyo (JP); Tetsuo Saji, Tokyo (JP); Hiroshi Nakamura, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 14/517,424

(22) Filed: Oct. 17, 2014

(65) Prior Publication Data

US 2015/0044822 A1    Feb. 12, 2015

Related U.S. Application Data

(62) Division of application No. 14/102,172, filed on Dec. 10, 2013, now Pat. No. 8,890,309.

(30) Foreign Application Priority Data

Aug. 8, 2013  (JP) ................................ 2013-165378

(51) Int. Cl.
| | | |
|---|---|---|
| *H01L 21/44* | (2006.01) | |
| *H01L 21/48* | (2006.01) | |
| *H01L 21/50* | (2006.01) | |
| *H01L 23/552* | (2006.01) | |

(Continued)

(52) U.S. Cl.
CPC ............... *H01L 23/552* (2013.01); *H01L 21/56* (2013.01); *H01L 21/52* (2013.01)

(58) Field of Classification Search
USPC .................... 438/106, 122, 121; 257/E21.499
See application file for complete search history.

(56) References Cited

U.S. PATENT DOCUMENTS

| 6,979,899 B2 | 12/2005 | Edwards |
| 2010/0181665 A1* | 7/2010 | Casey et al. ................. 257/723 |
| 2011/0013368 A1 | 1/2011 | Nagaike |

FOREIGN PATENT DOCUMENTS

| JP | H06-125191 A | 5/1994 |
| JP | 2003-209386 A | 7/2003 |

(Continued)

OTHER PUBLICATIONS

Office Action used in corresponding Japanese Application No. 2013-169423 dated Oct. 1, 2013 and English translation of the same (5 pages).

(Continued)

*Primary Examiner* — Hoai V Pham
(74) *Attorney, Agent, or Firm* — Fitch Even Tabin & Flannery LLP

(57) ABSTRACT

A circuit module includes a circuit substrate, at least one mount component, sealing bodies, and a shield. The circuit substrate includes a mount surface. The mount component is mounted on the mount surface. The sealing body is formed on the mount surface, covers the mount component and has a first sealing body section having a first thickness and a second sealing body section having a second thickness larger than the first thickness. The shield covers the sealing body and has a first shield section formed on the first sealing body section and having a third thickness and a second shield section formed on the second sealing body section and having a fourth thickness smaller than the third thickness. The sum of the fourth thickness and the second thickness equals to the sum of the first thickness and the third thickness.

2 Claims, 14 Drawing Sheets

(51) Int. Cl.
*H01L 21/56* (2006.01)
*H01L 21/52* (2006.01)

(56) References Cited

FOREIGN PATENT DOCUMENTS

| JP | 2006-286915 A | 10/2006 |
|---|---|---|
| JP | 2007-157891 A | 6/2007 |
| JP | 2008-130915 A | 6/2008 |
| JP | 2011-165931 A | 8/2011 |
| JP | 2012-015548 A | 1/2012 |
| WO | 2009/090690 A1 | 7/2009 |

OTHER PUBLICATIONS

Final Office Action issued in corresponding Japanese Application No. 2013-169423 dated Dec. 3, 2013 and English translation of the same (7 pages).

\* cited by examiner

CIRCUIT MODULE AND METHOD OF PRODUCING CIRCUIT MODULE

CROSS-REFERENCE TO A RELATED APPLICATION

This application is a divisional of U.S. application Ser. No. 14/102,172, filed Dec. 10, 2013, which claims the benefit of the filing date of Japanese Patent Application No. JP 2013-165378, filed Aug. 8, 2013, which are all hereby incorporated herein by reference in their entirety.

FIELD

The present disclosure relates to a circuit module including a circuit substrate on which at least one mount component is mounted and sealed.

BACKGROUND

A widely-used circuit module includes a circuit substrate on which at least one mount component is mounted and a peripheral of the mount component is sealed by a sealing body made of a synthetic resin etc. In such a circuit module, a surface of the sealing body is coated with a conductive material to be used as a shield against interruption induced by electromagnetic waves (hereinafter referred to as electromagnetic interruption). The electromagnetic interruption is interference, unnecessary radiation or the like, for example. By providing the shield, the electromagnetic interruption caused by the electromagnetic waves emitted from the mount component in the shield against electronic devices etc. outside of the shield is prevented (emission is improved), or the electromagnetic interruption caused by the electromagnetic waves emitted outside from the shield against the mount component in the shield is prevented (immunity is improved).

For example, Japanese Patent Application Laid-open No. 2006-286915 discloses a circuit module where electronic components mounted on a circuit substrate are sealed by an insulating resin layer, and a surface of the insulating resin layer is covered by a conductive resin layer. The conductive resin layer offers a noise shielding effectiveness.

SUMMARY

The thicker the above-described shield is, the higher the shielding effectiveness is. However, if the shield is thicker, a size (in particular, a thickness) of the circuit module undesirably grows. In recent years, as electronic devices gets down sized, the circuit module is also necessary to be downsized (low-profile). In addition, if the shield gets thick, a large amount of the shielding material is necessary, which may results in undesirably increased manufacturing costs of the circuit module.

In view of the above-described circumstances, it is desirable to provide a circuit module having a high shielding effectiveness and a low profile, and a method of producing the same.

According to an embodiment of the present disclosure, there is provided a circuit module including a circuit substrate, at least one mount component, a sealing body, and a shield.

The circuit substrate includes a mount surface.

The mount component is mounted on the mount surface.

The sealing body is formed on the mount surface, covers the mount component and has a first sealing body section having a first thickness and a second sealing body section having a second thickness larger than the first thickness.

The shield covers the sealing body and has a first shield section formed on the first sealing body section and having a third thickness and a second shield section formed on the second sealing body section and having a fourth thickness smaller than the third thickness. The sum of the fourth thickness and the second thickness equals to the sum of the first thickness and the third thickness.

According to an embodiment of the present disclosure, there is provided a method of producing a circuit module including mounting a mount component on a mount surface of a circuit substrate.

A sealing body for covering the mount component on the mount surface is formed to have a first sealing body section having a first thickness and a second sealing body section having a second thickness larger than the first thickness.

A shield is formed by coating a shielding material to form a plane parallel to the mount surface.

These and other objects, features and advantages of the present disclosure will become more apparent in light of the following detailed description of best mode embodiments thereof, as illustrated in the accompanying drawings.

DETAILED DESCRIPTION OF EMBODIMENTS

Figure 1:
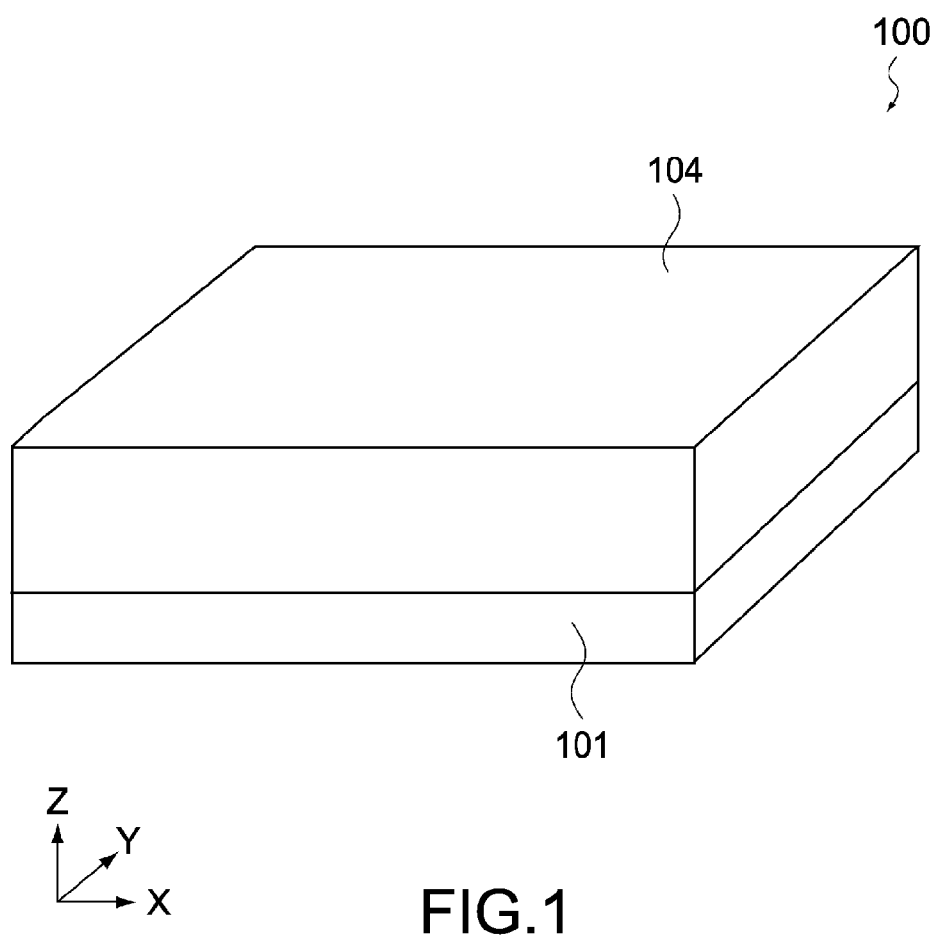
FIG. 1 is a perspective view of a circuit module according to an embodiment of the present disclosure.

A circuit module according to an embodiment of the present disclosure includes a circuit substrate, a mount component, a sealing body, and a shield.

The circuit substrate includes a mount surface.

The mount component is mounted on the mount surface.

The sealing body is formed on the mount surface, covers the mount component and has a first sealing body section having a first thickness and a second sealing body section having a second thickness larger than the first thickness.

The shield covers the sealing body and has a first shield section formed on the first sealing body section and having a third thickness and a second shield section formed on the second sealing body section and having a fourth thickness smaller than the third thickness. The sum of the fourth thickness and the second thickness equals to the sum of the first thickness and the third thickness.

By this configuration, the thick first shield section can provide a high shielding effectiveness to the mount component to be shielded among the mount components. When a whole shield is thick, the circuit module becomes thick and it is difficult to provide a low-profile circuit module. In sharp contrast, by the above-described configuration, as the thick first shield section is formed on the thin first sealing body section, it is possible to effectively shield the mount component to be shielded, while the thickness of the circuit module is kept. In other words, the circuit module having a high shielding effectiveness and a low profile can be provided.

The mount component includes an RF (Radio Frequency) component configuring an RF circuit, and the first sealing body section may cover the RF component.

The RF circuit used in communication devices etc. is easily affected by the electromagnetic interruption outside of the circuit module, and easily invites the electromagnetic interruption to outside of the circuit module. Thus, the RF circuit should be protected by a shield. By the above-described configuration, the first sealing body section covers the RF component of the RF circuit. In other words, the thick first shield section is disposed on the RF component and it is thus possible to provide the RF circuit with high shielding effectiveness.

The second sealing body section covers the mount component having the highest mount height from the mount surface among the mount components, and the second thickness is larger than the highest mount height of the mount component. The first sealing body section does not cover the mount component having the highest mount height, and the first thickness is smaller than the highest mount height of the mount component.

As the second sealing body section should cover the mount component having the highest mount height (hereinafter referred to as "the highest mount component"), it is difficult to decrease the thickness of the second sealing body section thinner than the mount height of the highest mount component. However, the first sealing body section can be thinner than the mount height of the highest mount component. In other words, even if the thickness of the circuit module is determined by the mount height of the highest mount component, the first shield section can be thicker (the third thickness) irrespective of the mount height of the highest mount component.

The third thickness may be from 75 μm to 200 μm. The fourth thickness may be from 1 μm to 75 μm.

By this configuration, the shield can provide the high shielding effectiveness by the first shield section having a thickness of 75 μm to 200 μm, and prevent the thickness of the circuit module from increasing by the second shield section having a thickness of 1 μm to 75 μm.

A method of producing a circuit module according to an embodiment of the present disclosure includes mounting at least one component on a mount surface of a circuit substrate.

A sealing body for covering the mount component is formed on the mount surface, the sealing body including a first sealing body section having a first thickness and a second sealing body section having a second thickness larger than the first thickness.

A shield is formed by coating a shielding material on the sealing body to form a plane parallel to the mount surface.

By this configuration, it is possible to equalize the sum of the thickness of the first sealing body (the first thickness) and the thickness of the first shield section (the third thickness) to the sum of the thickness of the second sealing body section (the second thickness) and the thickness of the second shield section (the fourth thickness). Thus, the circuit module can be produced where the first shield section is formed on the first sealing body section and the second shield section is formed on the second sealing body section.

[Configuration of Circuit Module]

Figure 2:
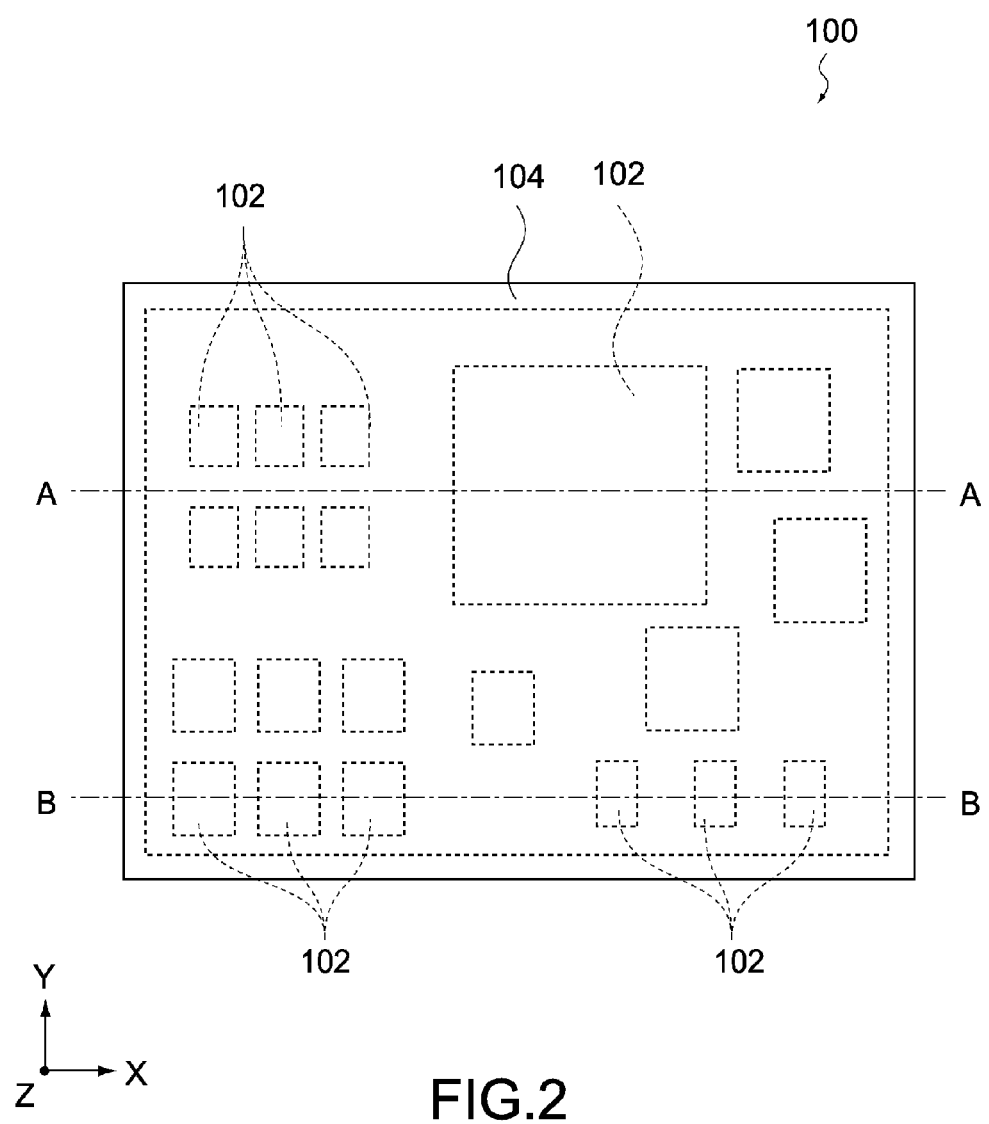
FIG. 2 is a plan view of the circuit module.
Figure 3:
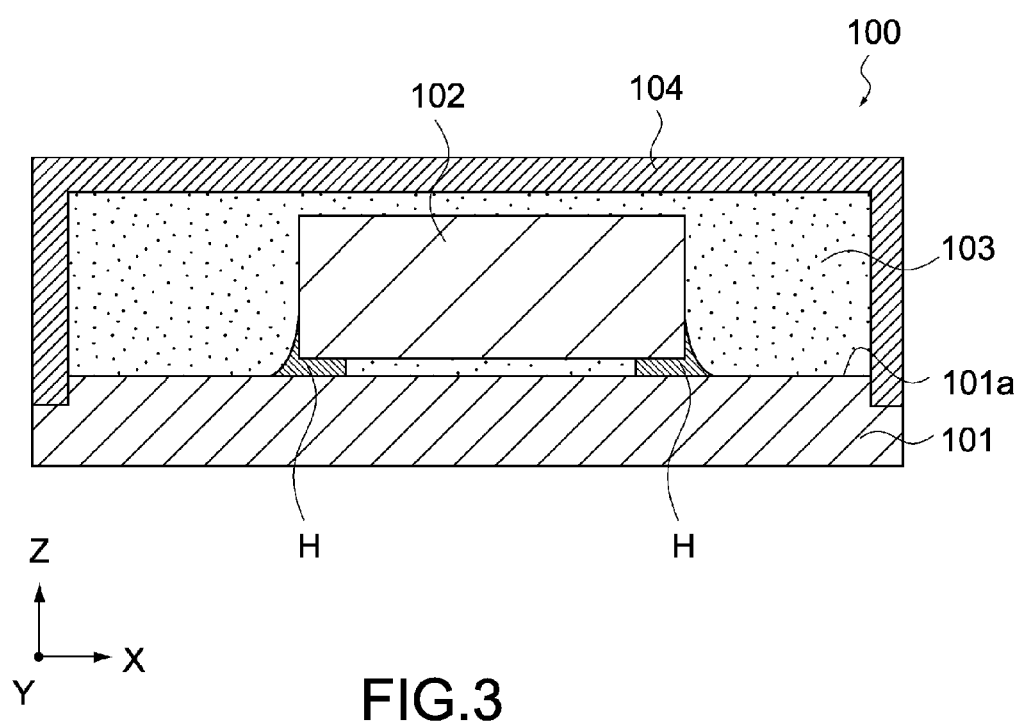
FIG. 3 is a sectional view of the circuit module (along the A-A line in FIG. 2)

FIG. 1 is a perspective view of a circuit module 100 according to an embodiment of the present disclosure. FIG. 2 is a plan view of the circuit module 100. FIG. 3 is a sectional view of the circuit module 100 along the A-A line in FIG. 2. In each view, an X direction, a Y direction and a Z direction are orthogonal to each other.

As shown in FIGS. 1 to 3, the circuit module 100 includes a circuit substrate 101, mount components 102, a sealing body 103, and a shield 104. Although a size or a shape of the circuit module 100 is not especially limited, the circuit module 100 may be a rectangular parallelepiped having a size of tens mm squares and a thickness of several mms.

The mount components 102 etc. are mounted on the circuit substrate 101. The circuit substrate 101 can be a multi-layer substrate on which a plurality of layers made of an insulating material such as a glass epoxy-based material and an insulating ceramic material are laminated. Within the layers, inter-layer wirings (not shown) may be formed. Hereinafter, a surface of the circuit substrate 101 on a side where the mount components 102 are mounted is defined as a mount surface 101a.

Figure 4:
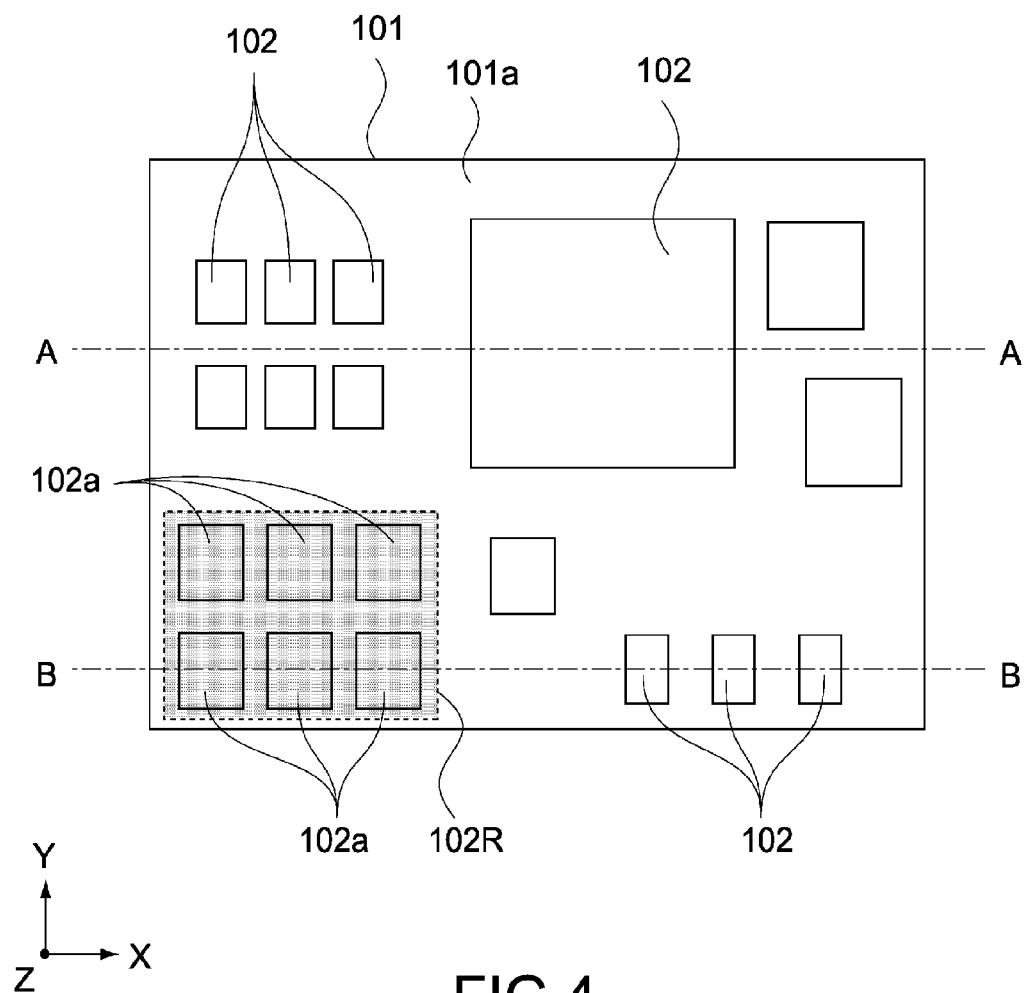
FIG. 4 is a schematic view showing an arrangement of mount components of the circuit module.

The mount components 102 are mounted on the mount surface 101a. FIG. 4 is a plan view showing an arrangement of the mount components 102 and does not show the shield 104 and the sealing body 103. An example of the mount components 102 is an integrated circuit (IC), a capacitor, an inductor, a resistor, a crystal oscillator, a duplexer, a filter, a power amplifier, or the like. The mount components 102 can be mounted on the mount surface 101a by solder joint using solder H (see FIG. 3).

Some of the mount components 102 can be components constituting the RF (Radio Frequency) circuit. Hereinafter, the mount components 102 constituting the RF circuit are referred to as RF components 102a. An example of the RF components 102a is an RFIC (Radio Frequency Integrated Circuit), a DC-DC converter, a power amplifier, a processor or the like.

As shown in FIG. 4, the RF components 102a can be mounted on a certain area on the circuit substrate 101. Hereinafter, the area where the RF components 102a are mounted is referred to as an RF area 102R. A plurality of the RF areas 102R may be disposed on the circuit substrate 101.

The sealing body 103 is made of a sealing material, and covers the mount components 102 on the mount surface 101a. For example, the sealing material is an insulating resin such as an epoxy resin to which silica or alumina is added. After the mount components 102 are mounted on the mount surface 101a, peripherals of the mount components 102 are filled with a fluid sealing material and the sealing material is cured to provide the sealing body 103. The thickness of the sealing body 103 will be described later.

The shield 104 is made of a shielding material that is a conductive material, and functions as a shield against the electromagnetic interruption. For example, the shielding material can be a conductive resin such as an epoxy resin containing conductive particles such as Ag and Cu. The thickness of the shield 104 will be described later.

The circuit module 100 has an above-described overall configuration. The shield 104 is disposed around the sealing body 103 covering the mount components 102, as described above. Thus, the shield 104 prevents the electromagnetic interruption against the mount components 102 and the electromagnetic interruption from the mount components 102 to outside of the circuit module 100.

[Thicknesses of Sealing Body and Shield]

Figure 5:
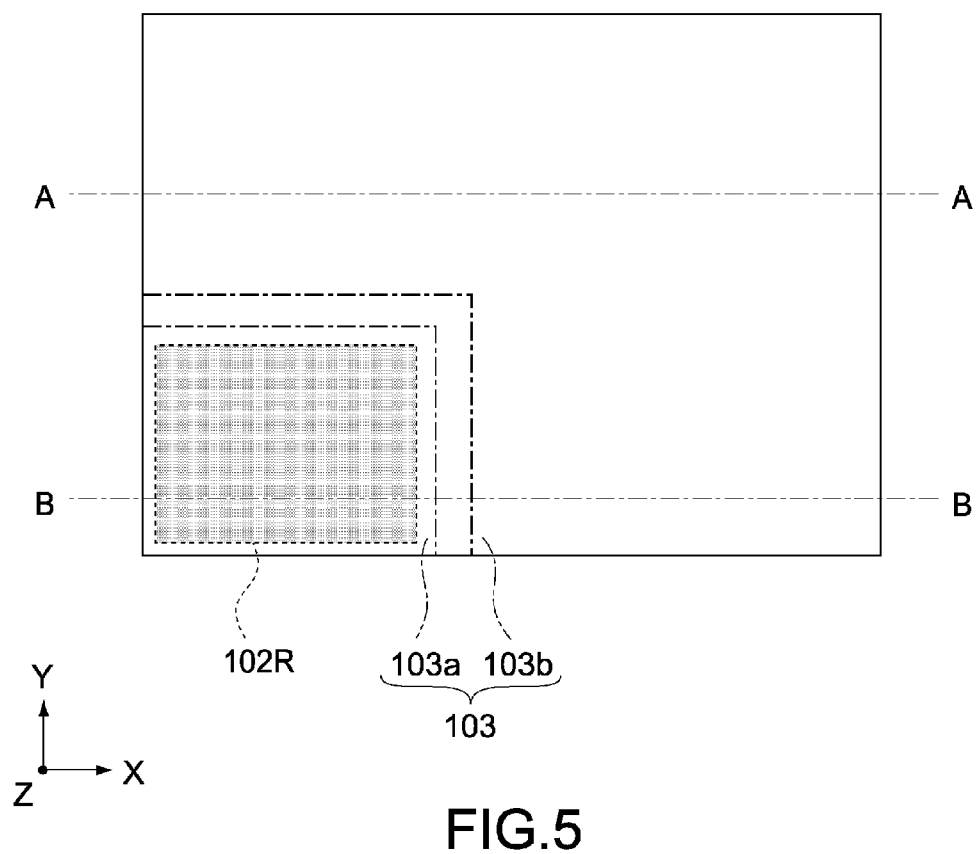
FIG. 5 is a plan view of a sealing body of the circuit module.
Figure 6:
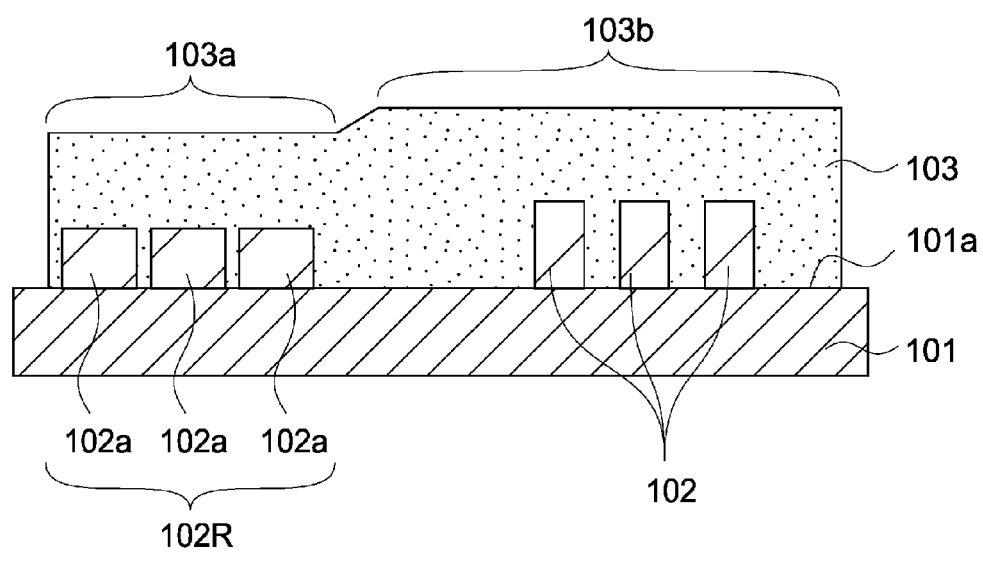
FIG. 6 is a sectional view of the sealing body of the circuit module (along the B-B line in FIG. 5)
Figure 6:
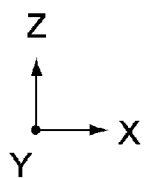

The thickness of the sealing body 103 will be described. FIG. 5 is a plan view of the sealing body 103 showing no shield 104 shown in FIG. 2. FIG. 6 is a sectional view of the sealing body 103 etc. along the B-B line in FIG. 5.

As shown in FIGS. 5 and 6, the sealing body 103 includes a first sealing body section 103a and a second sealing body section 103b. The first sealing body section 103a has a thickness different from that of the second sealing body section 103b.

Figure 7:
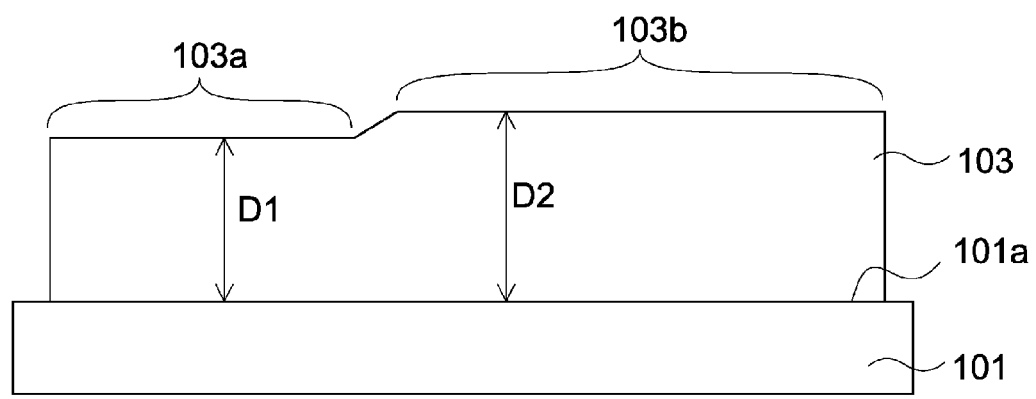
FIG. 7 is a schematic view showing a thickness of the sealing body of the circuit module.
Figure 7:
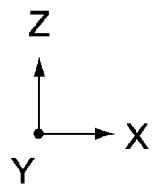

FIG. 7 is a schematic view showing thicknesses of the first sealing body section 103a and the second sealing body section 103b. As shown in FIG. 7, the thickness of the sealing body 103 ranges from the mount component 101a to the surface of the sealing body 103. The first sealing body section 103a has a thickness D1 and the second sealing body section 103b has a thickness D2 larger than the thickness D1.

Here, as shown in FIG. 5, the first sealing body section 103a can cover at least the RF area 102R. In addition, the first sealing body section 103a may cover other areas in addition to the RF area 102R.

Figure 8:
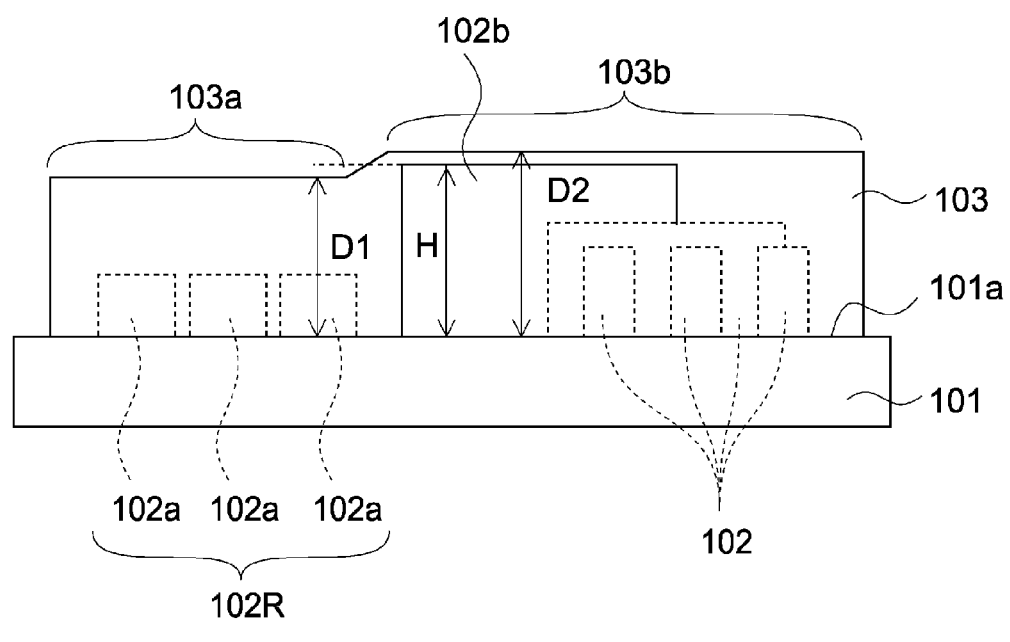
FIG. 8 is a schematic view showing the thickness of the sealing body of the circuit module.

FIG. 8 is a schematic view showing a relationship between the thicknesses of the sealing body 103 and the heights of the mount components 102. As shown in FIG. 8, a mount component having the highest mount height (height from the mount surface 101a) among the mount components 102 is denoted as the highest mount component 102b, and the mount height of the highest mount component 102b is denoted as a height H. The first sealing body section 103a does not cover the highest mount component 102b, but the second sealing body section 103b can cover the highest mount component 102b.

As shown in FIG. 8, the thickness D2 of the second sealing body section 103b should be larger than at least the height H so that the highest mount component 102b is not exposed. On the other hand, the thickness D1 of the first sealing body section 103a can be smaller than the height H as the first sealing body section 103a does not cover the highest mount component 102b.

In general, a processor or a memory can be the highest mount component 102b. In most cases, the RF components of the RF circuit have the mount heights smaller than that of the processor or the memory. In other words, when the first sealing body section 103a covers the RF area 102R, the first sealing body section 103a does not cover the highest mount component 102b.

Between the first sealing body section 103a and the second sealing body section 103b, there can be disposed a region where the thickness of the sealing body 103 is gradually changed (a sloped region), as shown in FIG. 6 etc. Also, the first sealing body section 103a may abut on the second sealing body section 103b, i.e., the first sealing body section 103a and the second sealing body section 103b may form a step.

Figure 9:
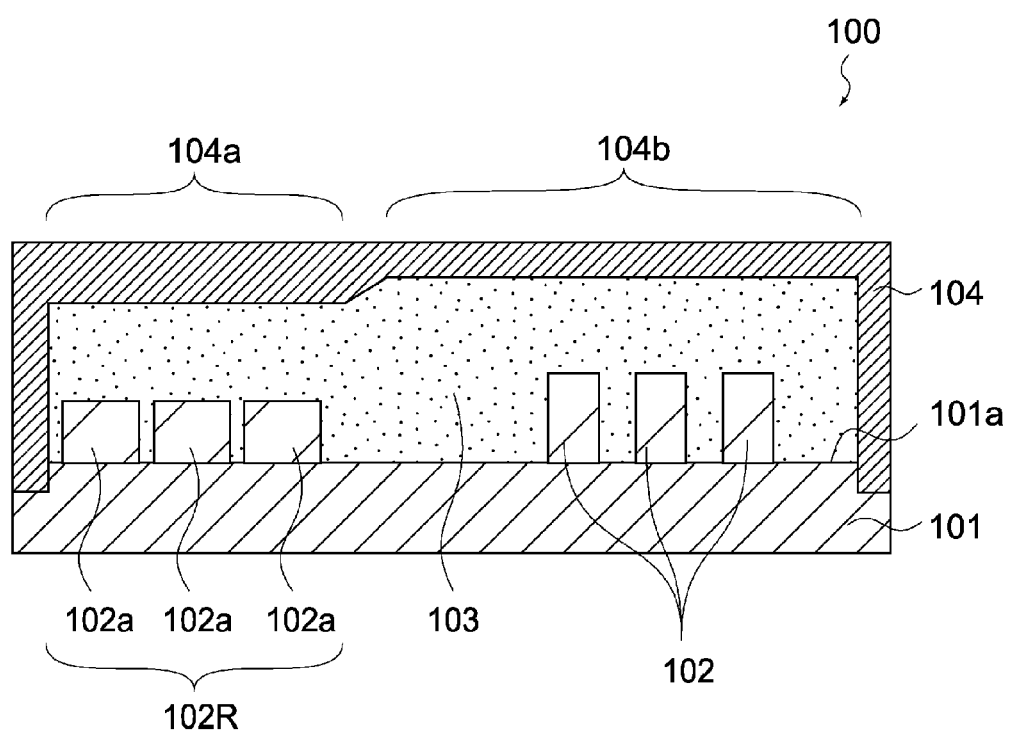
FIG. 9 is a sectional view of the circuit module (along the B-B line in FIG. 2)
Figure 9:
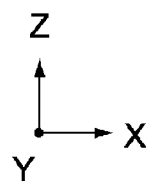

The thickness of the shield 104 will be described. FIG. 9 is a sectional view of the circuit module 100 along the B-B line in FIG. 2. As shown in FIG. 9, the shield 104 includes a first shield section 104a and a second shield section 104b. The first shield section 104a has a thickness different from that of the second shield section 104b. As shown in FIGS. 7 and 9, the first shield section 104a is formed on the first sealing body section 103a, and the second shield section 104b is formed on the second sealing body 103b.

Figure 10:
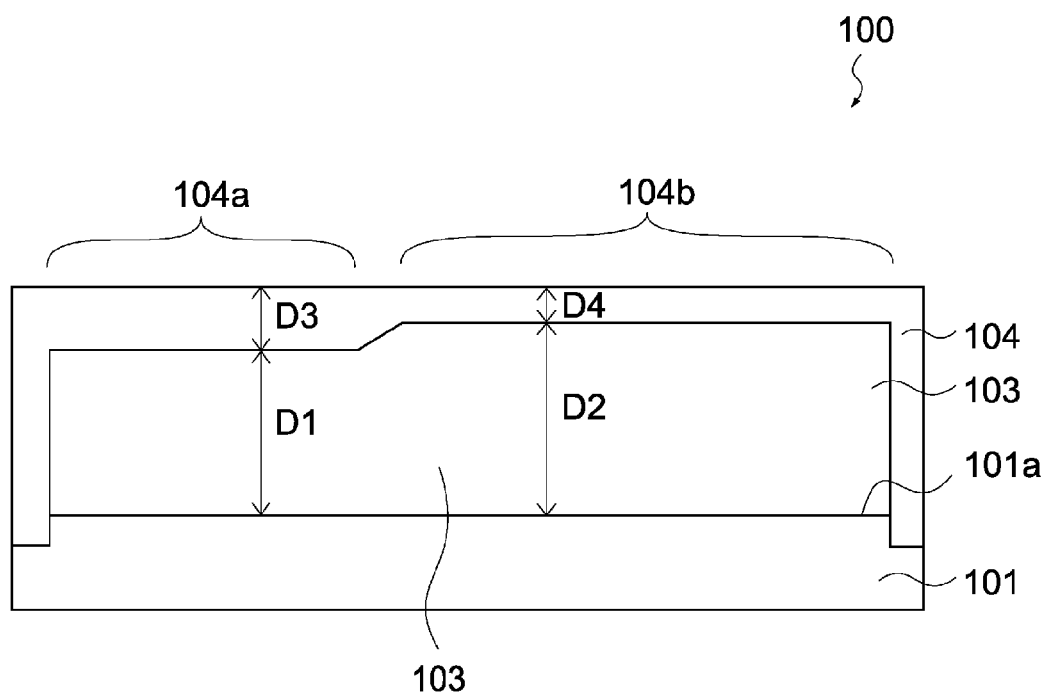
FIG. 10 is a schematic view showing the thickness of the shield of the circuit module.
Figure 10:
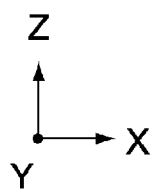

FIG. 10 is a schematic view showing the thicknesses of the first shield section 104a and the second shield section 104b. As shown in FIG. 10, the thickness of the shield 104 ranges from the surface of the sealing body 103 to the surface of the shield 104. The thickness of the first shield section 104a is denoted as a thickness D3, and the thickness of the second shield section 104b is denoted as a thickness D4. The thickness D3 is larger than the thickness D4. The thicknesses D3 and D4 are such that the sum of the thickness D1 and the thickness D3 equals to the sum of the thickness D2 and the thickness D4. In this way, the surface of the shield 104 is a plane parallel to the mount surface 101a.

Specifically, the thickness D3 can be from 75 μm to 200 μm. The thickness D4 can be from 1 μm to 75 μm. Between the first shield section 104a and the second shield section 104b, there can be disposed a region where the thickness of the shield 104 is gradually changed, as shown in FIG. 9 etc. Also, the first shield section 104a may abut on the second shield section 104b.

The first shield section 104a is formed on the first sealing body section 103a. As described above, when the first sealing body section 103a is formed to cover the RF areas 102R, the first shield section 104a is formed on the RF areas 102R.

[Advantages]

In the circuit module 100, the shield 104 functions as the shield against the electromagnetic interruption. Specifically, the shield 104 prevents exogenous noises, interference, immunity (electromagnetic compatibility) interruption or the like applied from outside of the mount components 102. Also, the shield 104 prevents unnecessary radiation or the like from the mount components 102 to outside of the circuit module 100.

Here, the shield 104 according to the present embodiment has the thick first shield section 104a. Thus, it is possible to provide the shielding effectiveness as described above at the first shield section 104a.

On the other hand, if all areas of the shield 104 are thick, the circuit module 100 also becomes large. This is not desirable for downsizing (providing the low-profile) of the circuit module 100. In contrast, the circuit module 100 according to the present embodiment can provide the high shielding effectiveness only at the necessary region while the thickness is maintained.

Especially when the second sealing body section 103b has to be thick in order to cover the highest mount component 102b, the first sealing body section 103a not covering the highest mount component 102b can be thin. In this way, the first shield section 104a can be thick without thicken the circuit module 100. Thus, the shielding effectiveness by the first shield section 104a can be sufficiently increased.

The RF circuit being capable of mounting to the circuit module 100 often needs shielding. For example, when the RF circuit is used for a transmitting circuit of a mobile phone, the leakage power of the RF circuit may interfere with other circuit components (a GPS, a sensor and the like). In addition, high-frequency waves of vibration signals in the RFIC of the RF circuit may radiate. As a result, the device on which the circuit module 100 is mounted may be failed. Furthermore, a switching noise of a DCDC converter in the device on which the circuit module is mounted, a switching noise (a digital noise) of a processor or a transmitting wave from other communication device may become an interruption wave to the RF circuit.

Thus, as described above, the first shield section 104a is formed on the RF circuit 102R configuring the RF circuit, the RF circuit can be mainly shielded while the thickness of the circuit module 100 is maintained.

Furthermore, the shield 104 is composed of the shielding material containing conductive particles, and has a thermal conductivity higher than the sealing material of the sealing body 103. As the first shielding section 104a is closer to the mount surface 101a than the second shielding section 104b, it is possible to generate a high heat releasing effect to the mount components 102 positioned under the first shielding section 104a. For example, the RF circuit is generally composed of high heat generating components such as the RFIC, a power amplifier or the like. The configuration according to the present embodiment is effective in terms of a heat releasing property.

In addition, by thickening only some of the shield 104 (the first shielding section 104a), the amount of the shielding material can be decreased, thereby reducing the manufacturing costs of the circuit module 100 as compared to the case where the whole shield is thickened.

[Method of Producing Circuit Module]

A method of producing the circuit module 100 will be described. FIGS. 11A to 11C and FIGS. 12A to 12C each is a schematic view showing a method of producing the circuit module 100. A plurality of circuit modules 100 can be produced on one circuit substrate at the same time, and be divided into each circuit module 100.

Figure 11A:
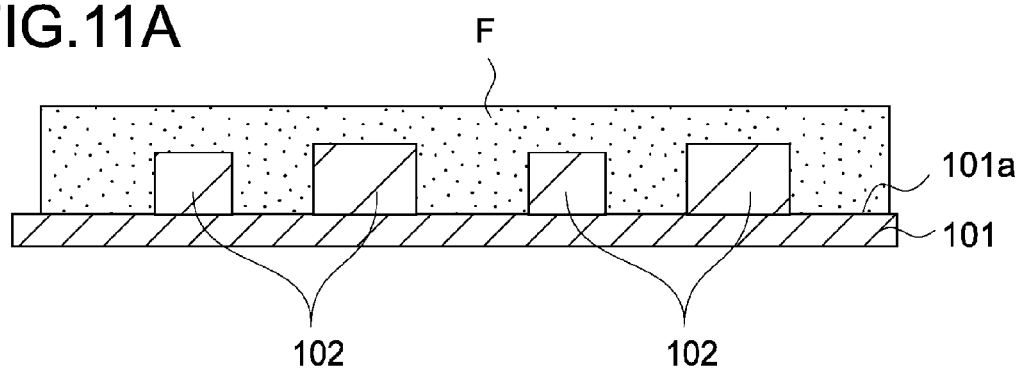
FIGS. 11A to 11C each shows a schematic view showing a method of producing the circuit module.

As shown in FIG. 11A, the circuit substrate 101 on which the mount components 102 are mounted is coated with a sealing material F. The sealing material F can be coated by a variety of coating methods including a spin coating method, a screen printing method and a vacuum printing method.

Figure 11B:
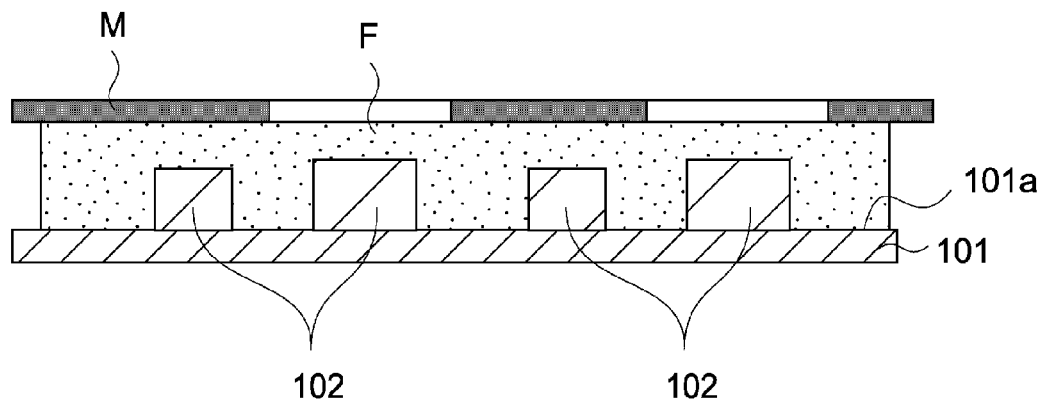
Figure 11C:
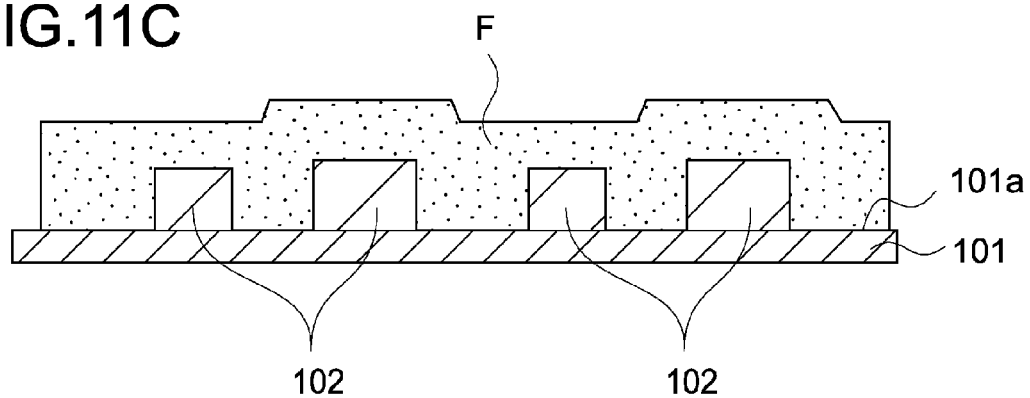

Next, as shown in FIG. 11B, the sealing material F coated is covered with a mask M having apertures. In this way, as shown in FIG. 11C, the sealing material F has two thicknesses. Then, the sealing material F is cured. For example, the sealing material F is baked to be cured.

Figure 12A:
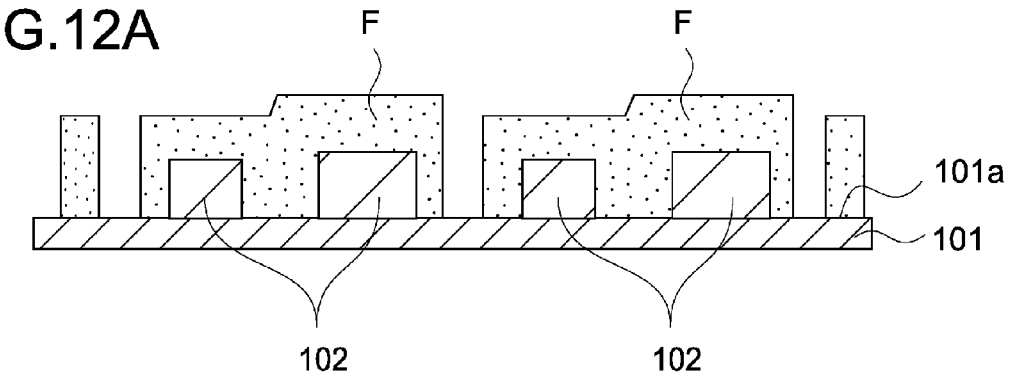
FIGS. 12A to 12C each shows a schematic view showing a method of producing the circuit module.

Next, as shown in FIG. 12A, the sealing material F cured is half-cut per the circuit module 100. For example, half-cut is done by dicing. In this way, the sealing bodies 103 are formed.

Figure 12B:
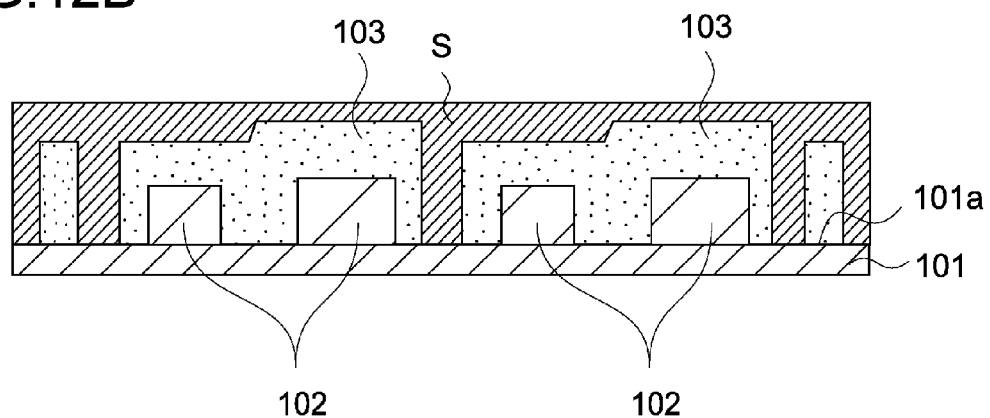

Next, as shown in FIG. 12B, a shielding material S is coated over the sealing bodies 103. The shielding material S can be coated by a printing. Here, the shielding material S is coated at a uniform thickness on the mount surface 101a not depending on the thicknesses of the sealing bodies 103. Then, the shielding material S is cured. For example, the shielding material S is baked to be cured.

Figure 12C:
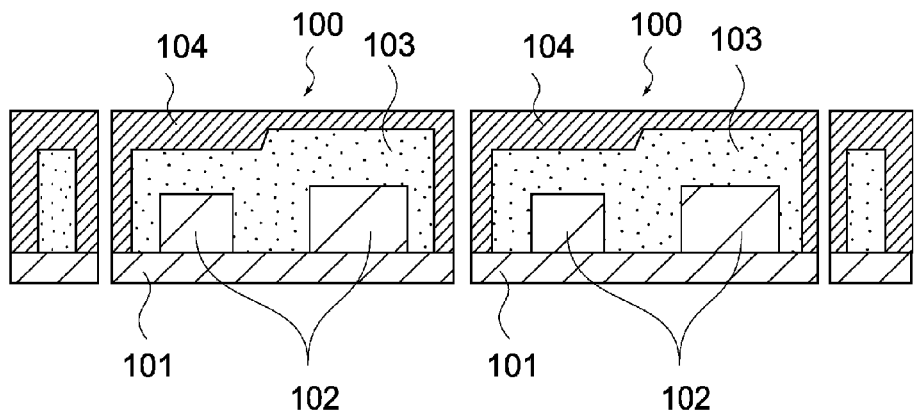

Next, as shown in FIG. 12C, the shielding material S and the circuit substrate 101 are cut (full-cut) per circuit module 100 to form shields 104. For example, cutting can be conducted by dicing. In this way, the circuit module 100 shown in FIG. 9 is produced. The method of producing the circuit module 100 is not limited to those described here.

ALTERNATIVE EMBODIMENTS

First Alternative Embodiment

Figure 13:
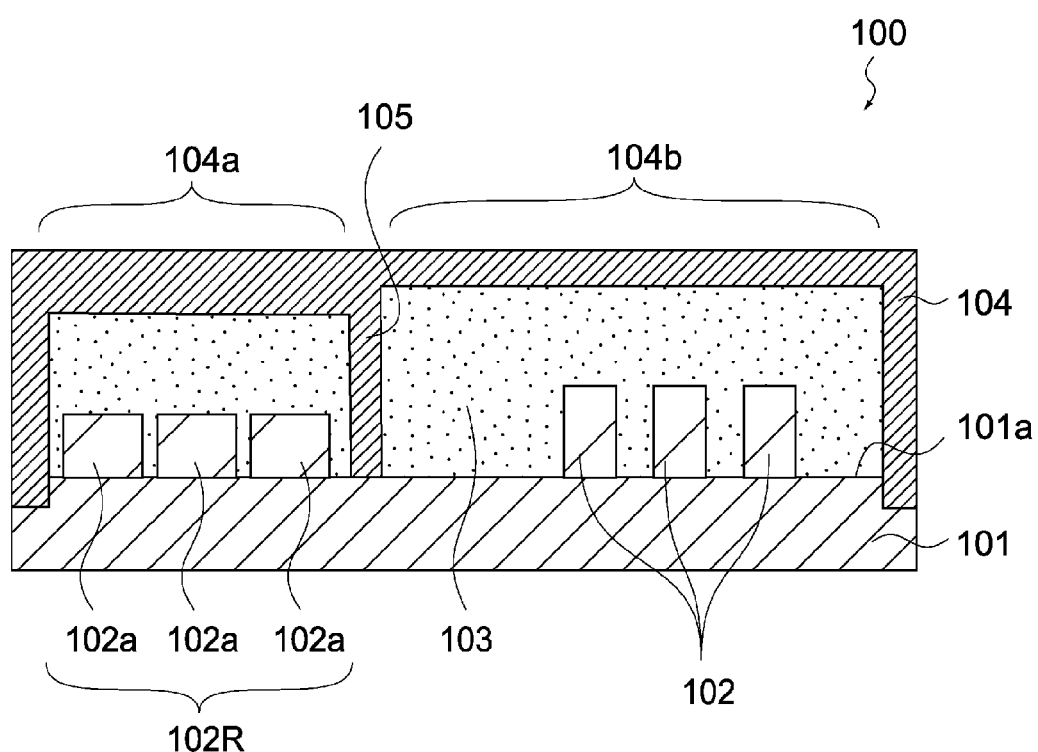
FIG. 13 is a sectional view of a circuit module according to a first alternative embodiment.

FIG. 13 is a sectional view of a circuit module 100 according to a first alternative embodiment. As shown in FIG. 13, the circuit module 100 may have an inner shield 105. The inner shield 105 is disposed to separate the mount components 102, and is to prevent the electromagnetic interruption between the mount components 102. For example, the inner shield 105 can be disposed to surround the peripheral of the above-described RF area 102R.

The inner shield 105 is composed of a conductive material, and is electrically connected to the shield 104. A trench is formed by irradiating the sealing body 103 with laser and a sealing material is coated thereon, whereby the inner shield 105 can be formed together with the shield 104. Alternatively, the inner shield 105 may be formed by burying a metal plate etc. into the sealing body 103.

The inner shield 105 is disposed to surround an area to be shielded (such as the RF area 102R), and the thick first shielding section 104a is formed on the area. Thus, the higher shielding effectiveness can be provided on the area.

Second Alternative Embodiment

Figure 14:
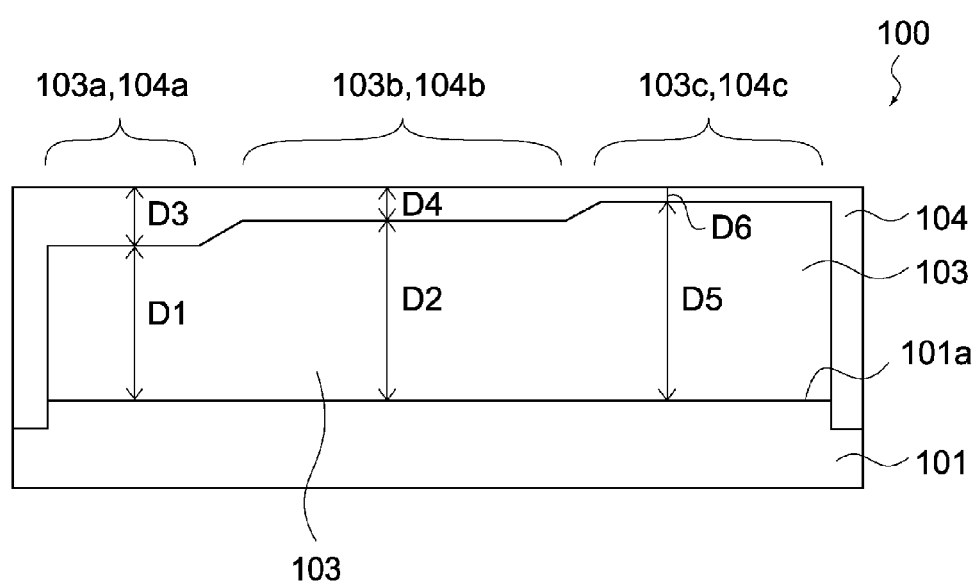
FIG. 14 is a schematic view showing thicknesses of a sealing body and a shield of a circuit module according to a second alternative embodiment.
Figure 14:
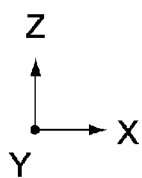

FIG. 14 is a schematic view showing thicknesses of a sealing body 103 and a shield 104 of a circuit module 100 according to a second alternative embodiment. As shown in FIG. 14, the sealing body 103 can have a third sealing body section 103c in addition to the first sealing body section 103a and the second sealing body section 103b. The third sealing body section 103c can be thicker (a thickness D5 in FIG. 14) than the second sealing body section 103b.

The shield 104 can have a third shield section 104c in addition to the first shield section 104a and the second shield section 104b. The third shield section 104c is formed on the third sealing body section 103c, and has a thickness (D6 in FIG. 14). The sum of the thickness D6 and the thickness D5 equals to the sum of the thickness D1 and the thickness D3 (the sum of the thickness D2 and the thickness D4).

Also in this case, the high shielding effectiveness can be provided only at the necessary region while the thickness of the circuit module 100 is maintained. In the second alternative embodiment, the sealing body 103 and the shield 104 have three thicknesses. A number of thicknesses can be available.

While the embodiments of the present disclosure are described, it should be appreciated that the disclosure is not limited to the above-described embodiments, and variations and modifications may be made without departing from the spirit and scope of the present disclosure.

What is claimed is:

1. A method of producing a circuit module, comprising:
mounting mount components including an RF (Radio Frequency) component configuring an RF circuit on a mount surface of a circuit substrate,
forming a sealing body for covering the mount component on the mount surface having a first sealing body section having a first thickness and a second sealing body section having a second thickness larger than the first thickness, the first sealing body section covering the RF component and not covering the mount component having a highest mount height from the mount surface among the mount components, the first thickness being smaller than the highest mount height of the mount component, the second sealing body section covering the mount component having the highest mount height from the mount surface among the mount components, and the second thickness being larger than the highest mount height of the mount component,
forming a shield by coating a shielding material to form a plane parallel to the mount surface.

2. The method of producing a circuit module according to claim 1, further comprising:
forming a trench surrounding the RF component on the sealing body; and filling the trench with the shielding material to form an inner shield.

\* \* \* \* \*